(12) United States Patent
Zhang et al.

(10) Patent No.: US 9,716,051 B2
(45) Date of Patent: Jul. 25, 2017

(54) OPEN SOLDER MASK AND OR DIELECTRIC TO INCREASE LID OR RING THICKNESS AND CONTACT AREA TO IMPROVE PACKAGE COPLANARITY

(71) Applicant: NVIDIA CORPORATION, Santa Clara, CA (US)

(72) Inventors: Leilei Zhang, Sunnyvale, CA (US); Ron Boja, Gilroy, CA (US); Abraham Yee, Cupertino, CA (US); Zuhair Bokharey, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 566 days.

(21) Appl. No.: 13/668,077

(22) Filed: Nov. 2, 2012

(65) Prior Publication Data

US 2014/0124913 A1 May 8, 2014

(51) Int. Cl.
*H01L 23/495* (2006.01)
*H01L 23/52* (2006.01)
(Continued)

(52) U.S. Cl.
CPC .......... *H01L 23/3128* (2013.01); *H01L 23/42* (2013.01); *H01L 23/49822* (2013.01); *H01L 23/562* (2013.01); *H05K 1/0271* (2013.01); *H01L 23/49816* (2013.01); *H01L 23/49827* (2013.01); *H01L 24/16* (2013.01); *H01L 2224/05571* (2013.01);
(Continued)

(58) Field of Classification Search
CPC ........... H01L 23/3128; H01L 23/49822; H01L 23/562; H01L 23/42; H01L 2924/00014; H01L 2224/05573; H01L 2224/05571; H01L 2224/16225; H01L 2924/3511; H01L 2924/3512; H01L 2224/16227; H01L 24/16; H01L 2924/15311; H01L 23/49827; H01L 23/49816; H05K 1/0271; H05K 2201/09136; H05K 2201/2009; H05K 3/4644
USPC ....... 257/773, 774, 674, 675, 676, 731, 782, 257/786, 691
See application file for complete search history.

(56) References Cited

U.S. PATENT DOCUMENTS 6,297,550 B1 * 10/2001 Chia et al. .................... 257/707
2010/0308451 A1 * 12/2010 Kodani ......................... 257/690

FOREIGN PATENT DOCUMENTS

TW     201108905 A     3/2011

* cited by examiner

*Primary Examiner* — Kimberly Rizkallah
*Assistant Examiner* — Dilinh Nguyen
(74) *Attorney, Agent, or Firm* — Artegis Law Group, LLP

(57) ABSTRACT

A packaging substrate, a packaged semiconductor device, a computing device and methods for forming the same are provided. In one embodiment, a packaging substrate is provided that includes a packaging structure having a chip mounting surface and a bottom surface. The packaging structure has at a plurality of conductive paths formed between the chip mounting surface and the bottom surface. The conductive paths are configured to provide electrical connection between an integrated circuit chip disposed on the chip mounting surface and the bottom surface of the packaging structure. The packaging structure has an opening formed in the chip mounting surface proximate a perimeter of the packaging structure. A stiffening microstructure is disposed in the opening and is coupled to the packaging structure.

20 Claims, 5 Drawing Sheets

(51) Int. Cl.
- *H01L 23/31* (2006.01)
- *H01L 23/42* (2006.01)
- *H01L 23/00* (2006.01)
- *H05K 1/02* (2006.01)
- H01L 23/498 (2006.01)
- H05K 3/46 (2006.01)

(52) U.S. Cl.
CPC ............... *H01L 2224/05573* (2013.01); *H01L 2224/16225* (2013.01); *H01L 2224/16227* (2013.01); *H01L 2924/00014* (2013.01); *H01L 2924/15311* (2013.01); *H01L 2924/3511* (2013.01); *H01L 2924/3512* (2013.01); *H05K 3/4644* (2013.01); *H05K 2201/09136* (2013.01); *H05K 2201/2009* (2013.01)

OPEN SOLDER MASK AND OR DIELECTRIC TO INCREASE LID OR RING THICKNESS AND CONTACT AREA TO IMPROVE PACKAGE COPLANARITY

BACKGROUND OF THE INVENTION

Field of the Invention

Embodiments of the present invention relate generally to integrated circuit chip packaging and, more specifically, improved package final planarity.

Description of the Related Art

In the packaging of integrated circuit (IC) chips, a semiconductor chip is usually mounted on a packaging substrate to facilitate electrical connection of the chip to a motherboard or other printed circuit board (PCB). ICs release heat as a result of power consumption. The heating up of the IC can adversely affect the power, performance and reliability of the device. The thermal concerns for ICs are nothing new and typically addressed during a product design. However, increased miniaturization of components and package density of the ICs have led to a decrease in available real-estate on the package to address the thermal concerns.

As an IC chip package heats up, the package can warp. Warping can break solder joints and terminal connections. Warping can damage an IC chip package beyond use or repair. The problem of warping has led to the inclusion of heat transfer and other microstructures for IC chip packaging. Examples of some of these microstructures include heat sinks and stiffing rings.

In order to provide the high density of electrical connections typical of modern IC chips and expanded wiring layout required for such chips, packaging substrates have advanced from being single-layered boards to multiple-layered boards that include multiple buildup layers formed on a core board. The microstructures used to address warping on these multiple-layered boards are typically located on the chip mounting surface of the packaging substrate. One such packaging substrate is illustrated in FIG. 1.

FIG. 1 provides a schematic cross-sectional view of a conventional packaged semiconductor device 180 configured to typical industrial practices. The packaged semiconductor device 180 includes an integrated circuit (IC) chip 107 coupled to a packaging substrate 100. The packaging substrate 100 provides the packaged semiconductor device 180 with structural rigidity as well as an electrical interface for routing input and output signals and power between the one or more IC chips 107 and an underlying support structure, such as a printed circuit board (PCB) (not shown). The one or more IC chips 107 may include any IC chip or die known in the art or later developed, such as a central processing unit, a graphics processing unit, or a memory chip, among others.

The packaging substrate 100 includes a substrate structure 125 having a stiffening microstructure 150 coupled thereto. The substrate structure 125 incorporates a core layer 101 and multiple buildup layers 102 on each side of the core layer 101. The core layer 101 may be fabricated from silicon, doped silicon such as n- or p-silicon, a carbon composite, or other suitable material. Buildup layers 102 may be fabricated from one or more conductive layers, such as copper layers, and one or more dielectric layers.

The stiffening microstructure 150 provides tensional rigidity to the packaging substrate 100 to promote planarity. In a conventional packaging substrate 100, the stiffening microstructure 150 is fastened to a chip mounting surface 110 of the substrate structure 125.

The stiffening microstructure 150 of the packaging substrate 100 may include a lid 151 (shown in phantom). The lid 151 may be fashioned from materials that provide certain thermal dynamic properties which may allow heat to more readily dissipate from the packaging substrate 100 and/or IC chip 107. The stiffening microstructure 150 may be adhered to the substrate structure 125 in a number of ways. Electrical and thermodynamic properties dictate the method and materials utilized in the adherence of the stiffening microstructure 150 to the substrate structure 125. For instance, the stiffening microstructure 150 may be coupled to the chip mounting surface 110 of the substrate structure 125 using a bonding agent (i.e., an adhesive) with properties selected to promote heat transfer in order to remove heat from the packaging substrate 100. Furthermore, the stiffening microstructure 150 provides tensional rigidity to the packaging substrate 100 to promote coplanarity with the IC chip 107 and underlying PCB (not shown).

A plurality of micro-bumps 103 are arrayed on the chip mounting surface 110 of the packaging substrate 100 and a plurality of solder balls 104 are arrayed on a bottom surface 120 for PCB mounting. The IC chip 107 is electrically coupled to chip mounting surface packaging substrate 100 by the micro-bumps 103, and packaging substrate 100 is electrically coupled to a support structure, such as a PCB (not shown), with the solder balls 104. To form electrical interconnects between micro-bumps 103 and solder balls 104, via structures 130 and interconnect lines 140 defining conductive pathways 164 are formed in core layer 101 and buildup layers 102. Solder mask layers 105 are utilized to prevent electrical short circuit connections between the solder balls 104 and micro-bumps 103 and the conductive pathways 164 formed through the substrate structure 125.

As shown in FIG. 1, a stiffening microstructure 150 is positioned along the on the chip mounting surface 110 of packaging substrate 100. The stiffening microstructure 150 may be configured as a ring 152 or a lid 151 (shown in phantom) to provide torsional stiffness to the packaging substrate 100 so as to resists warping. The lid microstructure 151 may act as a heat sink as well for the packaging substrate 100.

As more and more devices are added to the packaging substrate 100, connection lengths are minimized further and substrate structures 125 are thinned, thereby reducing the rigidity of the substrate structures 125. The thinned substrate structures 125 are more suspectible to stress due to heat and heat induced warping, which undesirably reduces the reliability of the packaged semiconductor device 180.

As the foregoing illustrates, there is a need in the art for a reliable packaging substrate that is easily manufactured and resist warping.

SUMMARY OF THE INVENTION

A packaging substrate, a packaged semiconductor device, a computing device and methods for forming the same are provided. In one embodiment, a packaging substrate is provided that includes a packaging structure having a chip mounting surface and a bottom surface. The packaging structure has at a plurality of conductive paths formed between the chip mounting surface and the bottom surface. The conductive paths are configured to provide electrical connection between an integrated circuit chip disposed on the chip mounting surface and the bottom surface of the packaging structure. The packaging structure has an opening formed in the chip mounting surface proximate a perimeter of the packaging structure. A stiffening microstructure is disposed in the opening and is coupled to the packaging structure.

In another embodiment, a computing device is provided that includes a packaged semiconductor device communicatively coupled to the memory. The packaged semiconductor device includes a packaging structure having a chip mounting surface and a bottom surface. The packaging structure has an opening formed in the chip mounting surface proximate a perimeter of the packaging structure. An integrated circuit chip is disposed on the chip mounting surface and communicatively coupled to the memory though the packaging structure. A stiffening microstructure is disposed in the opening and coupled to the packaging structure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

One embodiment of the present invention provides a stiffening microstructure coupled to a packaging substrate below a chip mounting surface of a packaging substrate, that is more warp resistant compared to conventional packaging substrates. Greater control of warping is gained through a larger stiffening microstructure and an increase contact area between the stiffening microstructure and the packaging substrate without increasing the overall height of the packaged chip. With the bottom of the stiffening microstructure extending below the chip mounting surface of the packaging substrate, the sectional profile of the stiffening microstructure can be selected to enhance torsional rigidity of the stiffening microstructure and thus provide greater warpage control for the packaging substrate. In some embodiments, an opening in the chip mounting surface can extend down through multiple build up layers of the packaging substrate to attach the stiffening microstructure directly to a core layer. Embodiments of the invention allows warping of packaging substrate to be controlled with a larger stiffening microstructure without increasing a footprint on the chip mounting surface of the packaging substrate utilized by the stiffening microstructure.

In another embodiment, an adhesive may bond the sides of the stiffening microstructure to side walls of the opening. For example, a bonding agent may be applied to both the bottom and the side surfaces of the stiffening microstructure and the bottom and side wall of the opening of the packaging substrate to improve the planarity of the package by increasing bond surface area between the microstructure and the packaging substrate and by also orientating the two bond interfaces in different planes, for example, in orthogonal planes.

Figure 2:
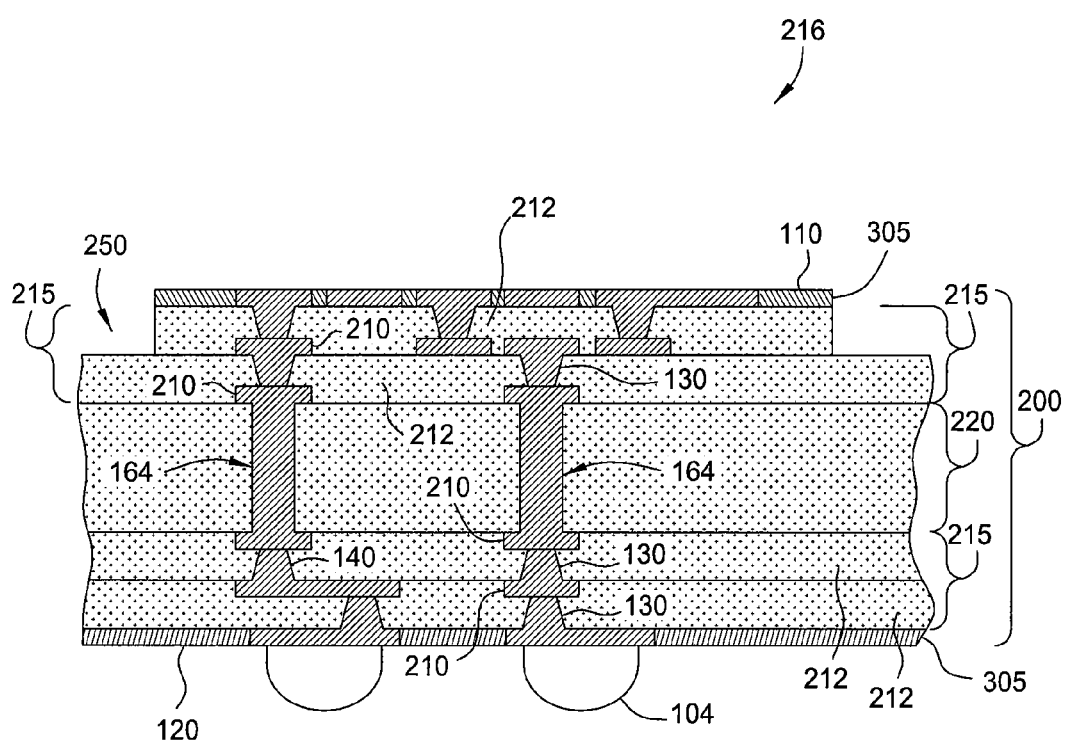
FIG. 2 is a schematic cross-sectional view of a substrate structure for a packaging substrate having an opening configured to receive a stiffening microstructure, according to an embodiment of the invention.
Figure 3:
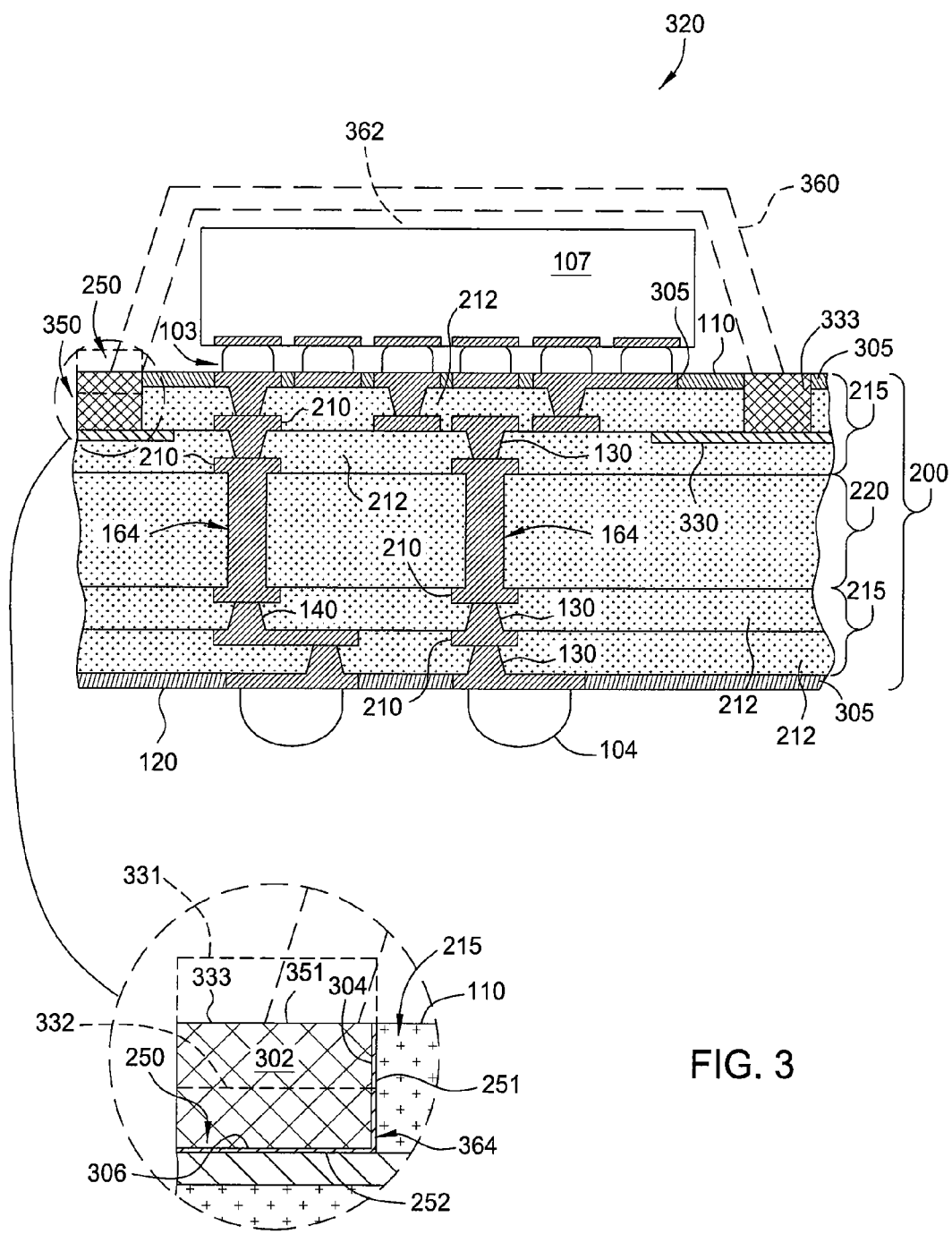
FIG. 3 is a schematic cross-sectional view of a packaged semiconductor device having packaging substrate configured with a stiffening microstructure, according to an embodiment of the invention.

FIG. 2 is a cross-sectional view of a substrate structure 200, according to an embodiment of the invention. The substrate structure 200 includes solder mask layers 305, buildup layers 215, and a core layer 220. The buildup layers 215 include one or more conductive (e.g., copper) layers 210 and one or more dielectric layers 212 utilized to form conductive pathways 164 between a chip mounting surface 110 and a bottom surface 120 of the substrate structure 200. The plurality of conductive pathways 164 formed between the chip mounting surface 110 and the bottom surface 120 of the substrate structure 200 provide an electrical circuit for an IC chip mounted on the substrate structure 200 and the surface to which the substrate structure 200 is mounted, for example, a PCB. Although two conductive pathways 164 are shown in FIG. 2 to avoid drawing clutter, additional conductive pathways may be present. In some embodiments, more than one IC chip may be mounted or electrically coupled to the chip mounting surface 110 of the substrate structure 200 with conductive pathways 164 disposed through the substrate structure configured to provide electrical connection between the integrated circuit chips disposed on the chip mounting surface 110 and the bottom surface 120. The solder mask layers 305 are utilized to prevent short circuit connections between the solder balls and micro-bumps and the conductive pathways 164 formed through the substrate structure 125 as seen in FIG. 3, later described below.

Continuing to refer to FIG. 2, the core layer 220 may be fabricated from a rigid and thermally insulating material on which one or more buildup layers 215 are formed. There are a number of suitable materials for manufacturing the core layer 220 and the buildup layers 215 that posses the requisite mechanical strength, electrical properties, and desirably low thermal conductivity desired for a substrate structure 200. Such materials include FR-2 and FR-4, which are traditional epoxy-based laminates, and the resin-based Bismaleimide-Triazine (BT) from Mitsubishi Gas and Chemical.

An opening 250 is formed in the top of the substrate structure 200 proximate a perimeter of the chip mounting surface 110. The opening 250 can be formed in the substrate structure 200 in any suitable manner, for example, by removing a portion of the chip mounting surface 110, or by selective deposition of the chip mounting surface 110 to form the opening, among others. The opening 250 has a geometry configured to receive a stiffening microstructure, as discussed below with reference to FIG. 3.

In the embodiment depicted in FIG. 2, the opening 250 has a sidewall 251 and a bottom surface 252. The bottom surface 252 is configured such that the bottom of the stiffening microstructure (as shown in FIG. 3) is recessed below the chip mounting surface 110. The depth of the opening 250 may extend through one or more of the buildup layers 215, and may even extend down to the core layer 220. That is, the bottom surface 252 of the opening 250 may be the exposed portion of the top of the core layer 220. In the example opening of FIG. 2, the opening 250 is through the chip mounting surface 110, and one or more of the buildup layers 215, but does not expose the core layer 220. It is contemplated that the depth and location of the opening 250 may be in one or more locations of the substrate structure 200.

FIG. 3 is a sectional view of a packaged semiconductor device 320 having a stiffening microstructure 351 and an IC chip 107 coupled to the substrate structure 200. At least a portion of the stiffening microstructure 351 deposed in the opening 250 of the substrate structure 200 is recessed below the chip mounting surface 110. In the example illustrated in FIG. 3, the substrate structure 200 includes an optional ground reference plane 330 disposed either in the buildup layers 215 or between the buildup layers 215 and the core layer 220. In the embodiment depicted in FIG. 3, the bottom 252 of the opening 250 is defined by the exposed portion of the ground reference plane 330.

The stiffening microstructure 351 may be fabricated from a rigid material, such as stainless steel, aluminum, among others. The stiffening microstructure 351 includes a base 302 sized to at least partially fit inside the opening 250 such that little or more air gap exists between the stiffening microstructure 351 and the substrate structure 200. In one embodiment, the base 302 may be configured as a ring 350. In another embodiment, the base 302 include a lid 360 (shown in phantom) which extends over the IC chip 107. In embodiments wherein the stiffening microstructure 351 includes a lid 360, an optional non-gaseous heat transfer medium 362 (shown in phantom) may provide a thermally conductive bridge between the lid 360 and IC chip 107 such that the stiffening microstructure 351 functions as a heat sink.

The base 302 has a geometry that mates with the opening 250 and may be bonded to the substrate structure 200. In the embodiment depicted in FIG. 3, the base 302 has an inner sidewall 304, a bottom 306 and a top 333. The bottom 306 of the base 302 is disposed in the opening 250 and is recessed below the chip mounting surface 110. The top 333 of the base 302 may be coplanar with the chip mounting surface 110, as shown in FIG. 3. Alternatively, top 333 of the base 302 may be disposed below the chip mounting surface 110, as illustrated by dashed line 332, or be disposed above the chip mounting surface 110, as illustrated by dashed line 331. Generally, the greater the distance between the bottom 306 and top 333 of the base 302, the stiffening microstructure 351 will be more rigid, and therefore, the packaging substrate 300 will be correspondingly more warp resistant compared to conventional structures.

The stiffening microstructure 351 may be coupled to the substrate structure via a bonding agent 364. The bonding agent 364 may optionally be utilized to substantially fill any gaps present between the stiffening microstructure 351 and the substrate structure 200. In one embodiment, the bonding agent 364 bonds the bottom 306 of the stiffening microstructure base 302 to the bottom surface 252 of the opening 250. The bonding agent 364 may be any suitable adhesive, for example an epoxy. The properties of the bonding agent 364 may be engineering to provide additional benefits as well. For example, the bonding agent 364 may be a dielectric or insulator material so that the stiffening microstructure 351 is electrically isolated from the conductors within the substrate structure 200. In another embodiment, the bonding agent 364 may be conductive material that provides an electrical connection from an electrical ground within the substrate structure 200 to the stiffening microstructure 351.

In another embodiment, the bonding agent 364 bonds the inner sidewall 304 of the stiffening microstructure base 302 to the sidewall 251 of the opening 250. Since the bonding interface between the inner sidewall 304 of the stiffening microstructure base 302 and the sidewall 251 of the opening 250 extends generally perpendicular to the plane of the substrate structure 200, the resistance to warpage of the substrate structure 200 is greatly increased relative to stiffening microstructures solely bonded to the substrate structure 200 in a plane parallel to the chip mounting surface 110. Moreover, in the embodiment depicted in FIG. 3, the bonding interface between the inner sidewall 304 of the stiffening microstructure base 302 and the sidewall 251 of the opening 250 is substantially cylindrical, further adding to warping resistance.

In yet another embodiment, the bonding agent 364 bonds the bottom 306 and inner sidewall 304 of the stiffening microstructure base 302 to the bottom surface 252 and sidewall 251 of the opening 250, thus significantly increasing the surface area of the bonding interface between the stiffening microstructure base 302 and the substrate structure 200. The increased surface area of the bonding interface further increases the resistance to warping of the substrate structure 200.

In one embodiment the stiffening microstructure 351 extends into the substrate structure 200 and is bonded to the ground reference plane 330. The stiffening microstructure 351 and bonding agent 364 may be conductive as to electrically couple the stiffening microstructure 351 to the ground reference plane 330, which places the stiffening microstructure 351 at the same reference potential as the ground reference plane 330.

Figure 1:
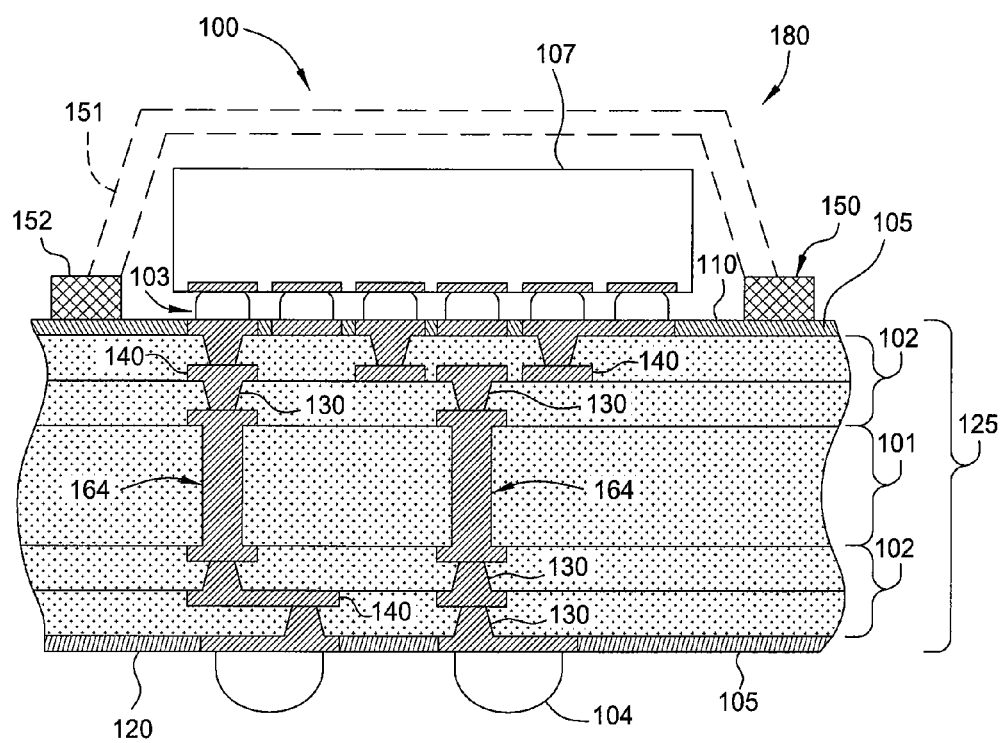
FIG. 1 is a schematic cross-sectional view of a conventional packaged semiconductor device having a packaging substrate that includes a stiffening microstructure.

In one embodiment, the stiffening microstructure 351 has a larger cross-sectional area in FIG. 3 when compared to the cross-section of the conventional stiffening microstructure shown in FIG. 1. As discussed above, the area and sectional profile of the cross-section of the to the conventional stiffening microstructure is dictated by design allowance for the opening on the chip mounting interface and the electrical pathways 164 within the substrate structure 200. The opening 250 is sized and located as not to interfere with other chip packaging functions. The stiffening microstructure 351 is bonded to the substrate structure 200. The larger the cross-sectional area of the stiffening microstructure 351, and the stronger the bond between the stiffening microstructure 351 and the substrate structure 200, the greater the resistance of packaging substrate 300 to warping. In one embodiment the ring 350 extends into the substrate structure 200 down to the ground reference plane 330. The ring 350 is bonded on its bottom and sides to the substrate structure 200.

Figure 4:
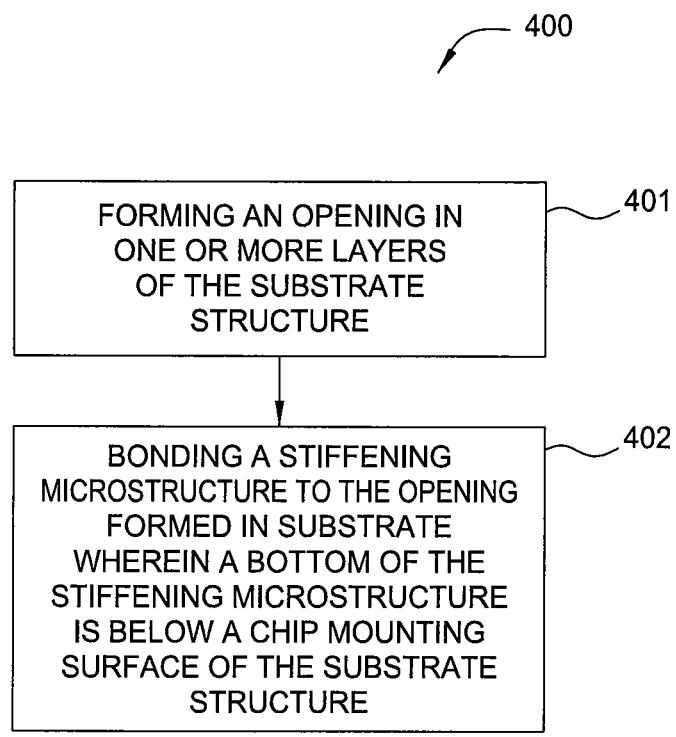
FIG. 4 sets forth a flow diagram of a method for forming a packaging substrate having a stiffening microstructure, according to an embodiment of the invention.

FIG. 4 sets forth a flow diagram of a method 400 for forming a packaging substrate, such as the packaging substrate 300 described above, according to an embodiment of the invention. The method 400 begins at step 402 where an opening is formed in one or more layers along the perimeter of the substrate structure. The opening is formed in substrate structure such that a bottom surface of the opening is recessed below the chip mounting surface of the substrate structure. The opening may be formed in the buildup of the layers during fabrication of the substrate structure. Alternately, the opening of the substrate structure may be formed by a material removal process, such as etching or milling the substrate. The opening may extend into the first layer or through multiple layers of the substrate structure, for example, down to the core layer. In one embodiment, the opening may be formed by a wet or plasma etching process to remove unmasked portions of the exposed chip mounting surface. Alternatively, the opening may be formed using other suitable techniques.

The opening may be designed to expose a determined layer of the substrate structure. For example, the opening may be formed through the solder layer. The opening may be formed through one or more layers of the buildup layers. The opening may be formed through the buildup layers so as to expose the core layer. The opening may be formed to exposed a ground plane within the substrate structure.

At step 403, a stiffening microstructure is disposed in the opening and adhered to the substrate structure using a bonding agent. The stiffening microstructure is bonded to at least one of the bottom surface or sidewalls the opening. The stiffening microstructure base is fastened to the substrate structure in a manner so as to provide a strong cohesion or bond. The strong bond of the stiffening microstructure to the substrate structure provides rigidity that enhances the ability of the substrate structure to resist warping.

As the stiffening microstructure of the present invention allow the base to utilized increased material thickness over conventional designs, greater moment forces can be counteracted. Thus, the stiffening microstructure allows substrate structures to be thinner while maintaining rigidity, and without sacrificing surface area on the mounting surface need for IC chip mounting. Additionally, by burying the stiffening microstructure at least partially below the chip mounting surface, the material thickness of the stiffening microstructure base may be increased without affecting the overall high of the packaged IC.

Figure 5:
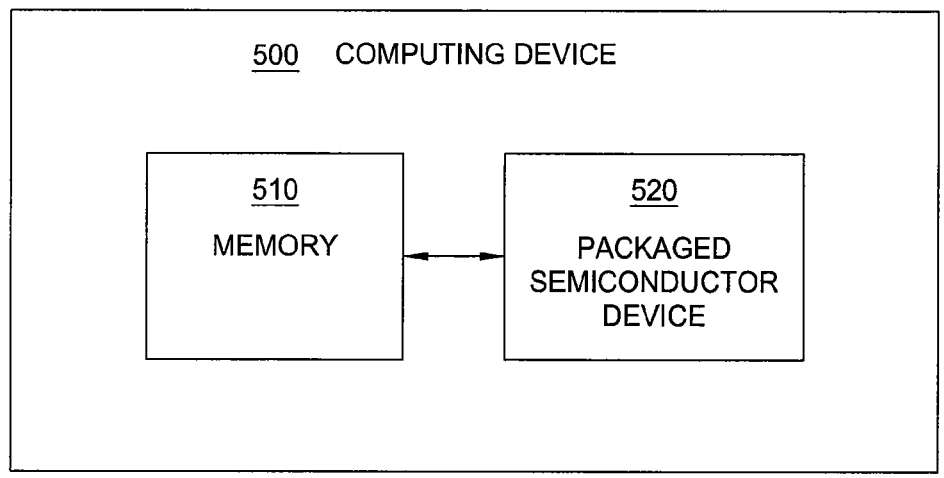
FIG. 5 illustrates a computing device in which one or more embodiments of the present invention can be implemented.

FIG. 5 schematically illustrates a computing device 500 in which one or more embodiments of the present invention can be implemented. The computing device 500 includes a packaged semiconductor device 320 configured according to an embodiment of the present invention as described above. The computing device 500 includes a memory 510 coupled to the packaged semiconductor device 320. Computing device 500 may be a desktop computer, a laptop computer, a smartphone, a digital tablet, a personal digital assistant, or other technically feasible computing device. Memory 510 may include volatile, non-volatile, and/or removable memory elements, such as random access memory (RAM), read-only memory (ROM), a magnetic or optical hard disk drive, a flash memory drive, and the like. Since the packaged semiconductor device 320 is fabricated in a manner that resists warping, the reliability and performance of the computing device 500 is enhanced.

In sum, embodiments of the invention set forth a semiconductor packaging substrate with an opening that extends through at least one layer of a substrate structure to accept a stiffening microstructure. Because the stiffening microstructure reduces potential warping of the substrate structure without increasing the foot-print utilized by conventional stiffening microstructures, enhanced planarity of the substrate structure may be maintained even in smaller packaging substrates. Additionally, certain embodiments provide that the stiffening microstructure is electrically coupled to a ground reference plane, thereby shielding the IC chip mounted on the substrate structure from undesirable electrical charges.

While the foregoing is directed to embodiments of the present invention, other and further embodiments of the invention may be devised without departing from the basic scope thereof, and the scope thereof is determined by the claims that follow.

We claim:

1. A packaging substrate comprising:
   a packaging structure having a chip mounting surface and a bottom surface, the packaging structure having at a plurality of conductive paths formed between the chip mounting surface and the bottom surface, the conductive paths providing electrical connection between an integrated circuit chip disposed on the chip mounting surface and the bottom surface, the packaging structure having an opening formed in the chip mounting surface proximate a perimeter of the packaging structure; and
   a stiffening microstructure disposed in the opening and coupled to the packaging structure.

2. The packaging substrate of claim 1, wherein the stiffening microstructure is bonded to a bottom surface of the opening.

3. The packaging substrate of claim 1, wherein the stiffening microstructure is bonded to a sidewall of the opening.

4. The packaging substrate of claim 1, wherein the stiffening microstructure extends above the chip mounting surface.

5. The packaging substrate of claim 1, wherein the chip mounting surface is on a solder mask layer, and the opening extends through the solder mask layer.

6. The packaging substrate of claim 5, wherein the packaging structure further comprises:
   a core layer disposed below the solder mask layer, the opening exposing a portion of the core layer.

7. The packaging substrate of claim 1 further comprising:
   an integrated circuit chip mounted on the chip mounting surface.

8. The packaging substrate of claim 7, wherein the stiffening microstructure includes a lid.

9. The packaging substrate of claim 8 further comprising:
   a heat transfer medium providing a thermally conductive pathway between the lid and the integrated circuit chip.

10. The packaging substrate of claim 1, wherein the stiffening microstructure is a ring.

11. The packaging substrate of claim 1, wherein the packaging structure further comprises:
    a ground reference plane layer disposed between the chip mounting surface and the bottom surface of the packaging structure, wherein the ground reference plane layer is in contact with the stiffening microstructure.

12. The packaging substrate of claim 1 further comprising a dielectric bonding agent coupling the stiffening microstructure to the packaging structure.

13. The packaging substrate of claim 1 further comprising a conductive bonding agent coupling the stiffening microstructure to the packaging structure.

14. A computing device, comprising:
    a memory; and
    a packaged semiconductor device communicatively coupled to the memory, wherein the packaged semiconductor device comprises:
    a packaging structure having a chip mounting surface and a bottom surface, the packaging structure having an opening formed in the chip mounting surface proximate a perimeter of the packaging structure;
    an integrated circuit chip disposed on the chip mounting surface and communicatively coupled to the memory though the packaging structure; and
    a stiffening microstructure disposed in the opening and coupled to the packaging structure.

15. The packaging substrate of claim 14, wherein the stiffening microstructure is bonded to at least one of a bottom surface and a sidewall of the opening.

16. The packaging substrate of claim 14, wherein the stiffening microstructure extends above the chip mounting surface.

17. The packaging substrate of claim 14, wherein the chip mounting surface is on a solder mask layer, and the opening extends through the solder mask layer.

18. The packaging substrate of claim 17, wherein the packaging structure further comprises:
   a core layer disposed below the solder mask layer, the opening exposing a portion of the core layer.

19. The packaging substrate of claim 14, wherein the stiffening microstructure is one of a ring or a lid.

20. The packaging substrate of claim 14, wherein the packaging structure further comprises:
   a ground reference plane layer disposed between the chip mounting surface and the bottom surface of the packaging structure, wherein the stiffening microstructure is in contact with ground reference plane layer.

* * * * *